(12) United States Patent
Shougomori et al.

(10) Patent No.: US 6,605,967 B2
(45) Date of Patent: Aug. 12, 2003

(54) LOW POWER CONSUMPTION OUTPUT DRIVER CIRCUIT AND SUPPLY VOLTAGE DETECTION CIRCUIT

(75) Inventors: Masanari Shougomori, Kyoto (JP); Koichi Inoue, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/924,113

(22) Filed: Aug. 8, 2001

(65) Prior Publication Data
US 2002/0024060 A1 Feb. 28, 2002

(30) Foreign Application Priority Data
Aug. 9, 2000 (JP) ......................................... 2000-240560

(51) Int. Cl.$^7$ .................................................. H03K 3/00
(52) U.S. Cl. .................. 327/108; 327/78; 327/198; 327/309; 326/82; 323/223; 323/265
(58) Field of Search ................................. 327/72, 77–80, 327/143, 89, 198, 309, 312, 318–322, 327, 328, 51, 52, 53, 56, 538, 540, 544, 545, 108–109; 323/223, 265, 315, 311–314; 326/82, 89

(56) References Cited

U.S. PATENT DOCUMENTS

| 4,994,759 A | * | 2/1991 | Jouen et al. ................. 327/309 |
| 5,999,041 A | * | 12/1999 | Nagata et al. ............... 327/108 |
| 6,011,413 A | * | 1/2000 | Hayakawa et al. ........... 327/51 |

* cited by examiner

*Primary Examiner*—Minh Nguyen
(74) *Attorney, Agent, or Firm*—Arent Fox Kintner Plotkin & Kahn, PLLC

(57) ABSTRACT

A semiconductor device has a transistor that controls, according to the resistance of the load externally connected to the output terminal thereof, the current fed to the base of an output-stage transistor for driving the load to turn it on. In this circuit configuration, even if a base current of the output-stage transistor is so determined as to permit the semiconductor device to drive the heaviest permissible load, only a reduced amount of extra current is fed to the base of the output-stage transistor when it is turned on with a light load connected to the semiconductor device.

8 Claims, 2 Drawing Sheets

LOW POWER CONSUMPTION OUTPUT DRIVER CIRCUIT AND SUPPLY VOLTAGE DETECTION CIRCUIT

BACKGROUND OF THE INVENTION

1. Field of the Invention

The present invention relates to a low power semiconductor device.

2. Description of the Prior Art

In a conventional semiconductor device, circuit constants are set in such a way that the semiconductor device can drive the heaviest load (in other words, the load having the lowest resistance) within the range of loads for which it is designed to drive. For example, as FIG. 3 shows, in the case of an output-stage transistor 3 for driving an external load 100, the current $I_B$ that is fed to the base of the transistor 3 to turn it on is set in such a way that the collector current $I_C$ of that transistor 3 fulfills $$I_C = (V_{CC} - V_{LOW})/R_{LMIN}$$

where $V_{CC}$ represents the supply voltage, $V_{LOW}$ represents the voltage desired at the output terminal OUT when the output-stage transistor 3 is turned on, and $R_{LMIN}$ represents the minimum value of the resistance of the load that can be connected as the load 100. Once set, this current $I_B$ that is fed to the base of the output-stage transistor 3 to turn it on is kept fixed.

Thus, in a conventional semiconductor device, the lighter the load (in other words, the higher the resistance of the load), the larger the amount of extra current that is fed to the base of the output-stage transistor when it is turned on, and thus the higher unnecessary current consumption. To reduce this unnecessary current consumption, it is necessary to narrow the range of resistance of loads for which the semiconductor device is designed to drive.

Moreover, since the output-stage transistor is turned on with a fixed base current irrespective of the resistance of the load, the output voltage obtained when the output-stage transistor is turned on varies greatly according to the resistance of the load.

SUMMARY OF THE INVENTION

An object of the present invention is to provide a semiconductor device that operates with reduced unnecessary current consumption, and with reduced variation in the output voltage resulting from variation in the resistance of the load, but without narrowing the range of resistance of loads for which the semiconductor device is designed to drive.

To achieve the above object, according to one aspect of the present invention, a semiconductor device is provided with a transistor that controls, according to the resistance of the load externally connected to the output terminal thereof, the current fed to the base of an output-stage transistor for driving the load to turn it on.

In this circuit configuration, even if circuit constants are so determined as to permit the semiconductor device to drive the heaviest permissible load, only a reduced amount of extra current is fed to the base of the output-stage transistor when it is turned on with a light load connected to the semiconductor device. In this way, it is possible to reduce unnecessary current consumption, without narrowing the range of resistance of loads for which the semiconductor device is designed to drive. Moreover, the lighter the load, the lower the current that is fed to the base of the output-stage transistor to turn it on. This helps reduce variation in the output voltage resulting from variation in the resistance of the load.

According to another aspect of the present invention, a semiconductor device is provided with: a constant-current source; a current amplifier circuit that is connected to the output side of the constant-current source; a first transistor that receives at the base thereof the current output from the current amplifier circuit, has the emitter thereof connected to a reference potential, and has the collector thereof connected to an output terminal; and a second transistor, of the opposite conductivity type to the first transistor, that has the base thereof connected to the output terminal, has the emitter thereof connected to the output side of the constant-current source, and has the collector thereof connected to the reference potential.

In this circuit configuration, the second transistor operates in such a way that, the lighter the load, the lower the input current to the current amplifier circuit. As a result, only a reduced amount of extra current is fed to the base of the first transistor when it is turned on. In this way, it is possible to reduce unnecessary current consumption without narrowing the range of resistance of loads for which the semiconductor device is designed to drive. Moreover, the lighter the load, the lower the current that is fed to the base of the output-stage transistor to turn it on. This helps reduce variation in the output voltage resulting from variation in the resistance of the load.

In this semiconductor device, it is also possible to additionally provide a third transistor that has the base thereof connected to the output side of the constant-current source, has the emitter thereof connected to the reference potential, and has the collector thereof connected to the output terminal, with the second transistor parasitic on the third transistor. This helps increase the withstand voltage against electrostatic destruction. Alternatively, it is also possible to additionally provide a supply voltage detection circuit that chooses whether to short-circuit the output side of the constant-current source to the reference potential or not according to the supply voltage.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
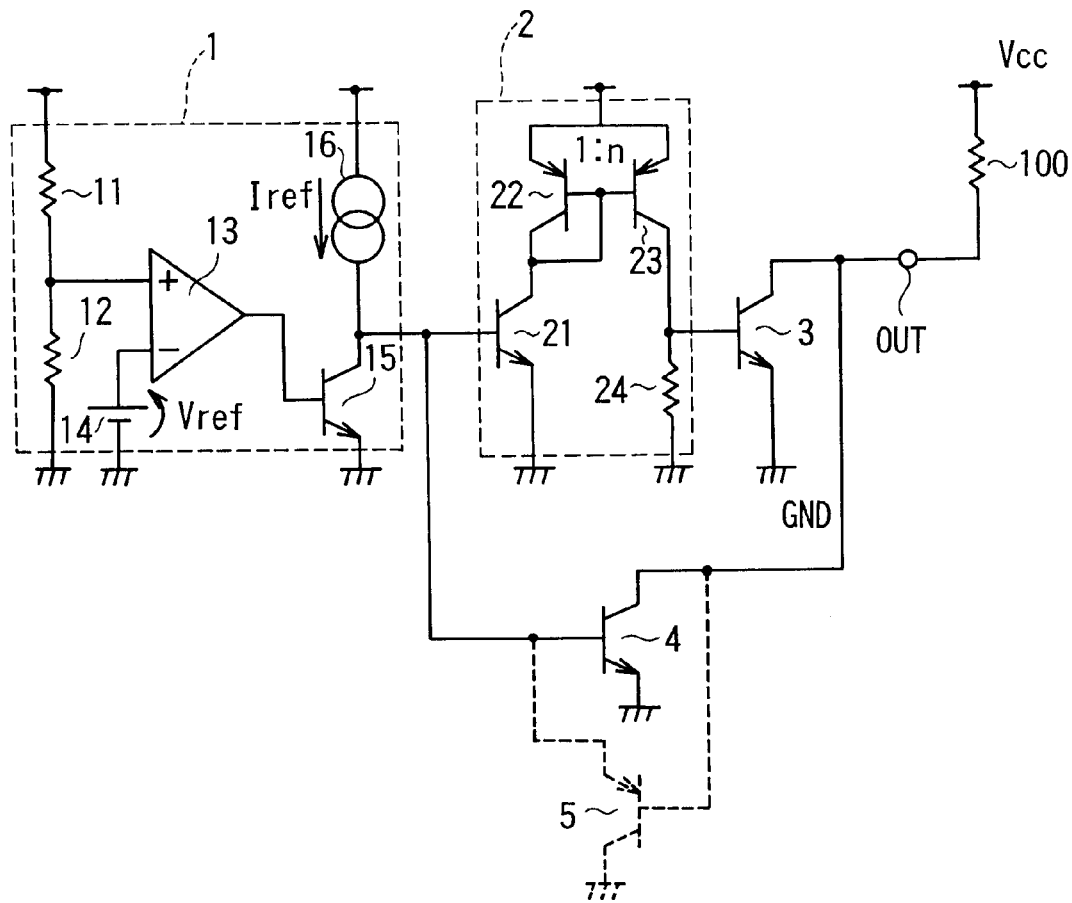
FIG. 1 is a circuit diagram of a semiconductor device embodying the invention.

Hereinafter, embodiments of the present invention will be described with reference to the drawings. FIG. 1 shows a circuit diagram of a semiconductor device embodying the invention. In this figure, reference numeral 1 represents a supply voltage detection circuit, reference numeral 2 represents a current amplifier circuit, reference numerals 3 and 4 represent NPN-type transistors, reference numerals 11 and 12 represent resistors, reference numeral 13 represents a comparator, reference numeral 14 represents a constant-voltage source, reference numeral 15 represents an NPN-type transistor, reference numeral 16 represents a constant-current source, reference numeral 21 represents an NPN-type transistor, reference numerals 22 and 23 represent PNP-type transistors, reference numeral 24 represents a resistor, and reference numeral 100 represents an externally connected load.

The supply voltage detection circuit 1 is composed of the resistors 11 and 12, comparator 13, constant-voltage source 14, transistor 15, and constant-current source 16. The resistors 11 and 12 are connected in series between a supply voltage $V_{CC}$ and ground GND. The comparator 13 has its non-inverting input terminal (+) connected to the node between the resistors 11 and 12, and receives at its inverting input terminal (−) a constant voltage $V_{ref}$ generated by the constant-voltage source 14. The transistor 15 has its base connected to the output terminal of the comparator 13, has its emitter connected to ground GND, and has its collector connected to the constant-current source 16.

The current amplifier circuit 2 is composed of the transistors 21, 22, and 23, and resistor 24. The transistor 21 has its base connected to the collector of the transistor 15, has its emitter connected to ground GND, and has its collector connected to the collector of the transistor 22. The transistor 22 has its base and collector connected together, and has its emitter connected to the supply voltage $V_{CC}$. The transistor 23 has its base connected to the base of the transistor 22, has its emitter connected to the supply voltage $V_{CC}$, and has its collector connected through the resistor 24 to ground GND.

The transistor 3 has its base connected to the node between the collector of the transistor 23 and the resistor 24, has its emitter connected to ground GND, and has its collector connected to an output terminal OUT. Between the supply voltage $V_{CC}$ and the output terminal OUT, the load 100 is connected externally.

Figure 2:
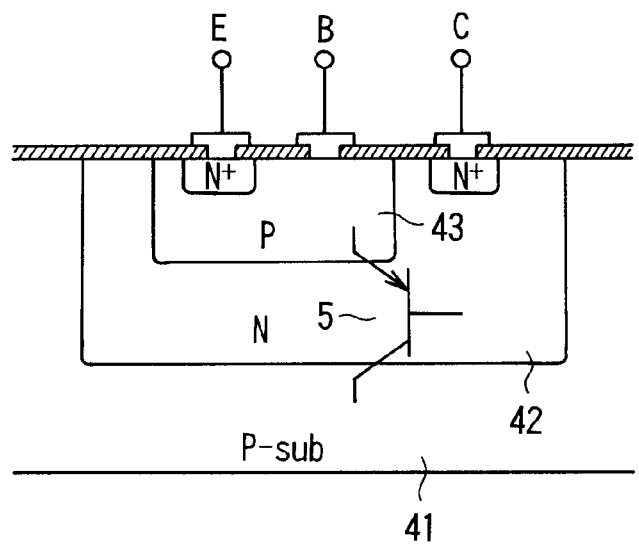
FIG. 2 is a sectional view of the transistor provided in a semiconductor device embodying the invention.
Figure 3:
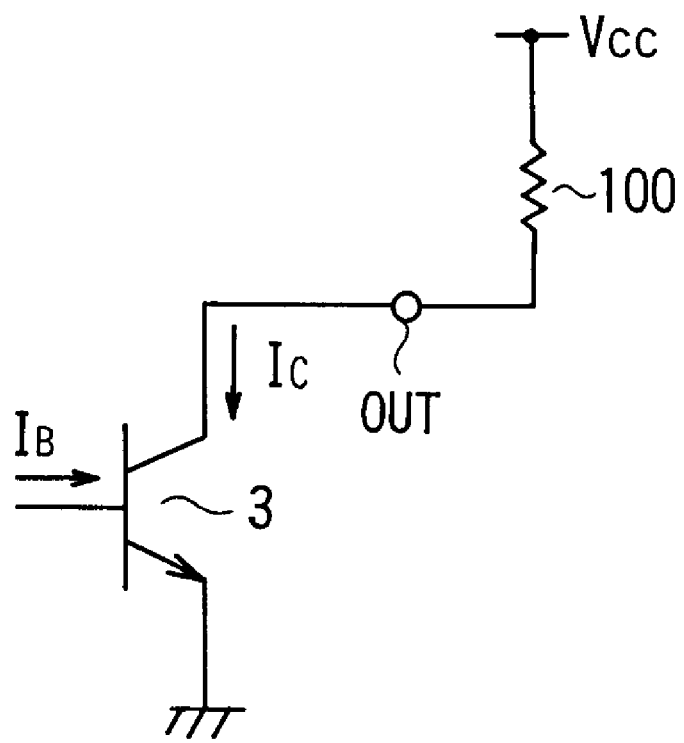
FIG. 3 is a diagram illustrating an example of prior art.

The transistor 4 has its base connected to the collector of the transistor 15, has its emitter connected to ground GND, and has its collector connected to the output terminal OUT. FIG. 2 shows a sectional view of the transistor 4. As this figure shows, the transistor 4 is so structured that a PNP-type transistor 5 is parasitic on it, with the base region 43, collector region 42, and substrate (P-type semiconductor substrate) 41 of the transistor 4 acting respectively as the emitter, base, and collector of the parasitic transistor 5. Another PNP-type transistor is parasitic on the transistor 3 also, but the effect of this parasitic transistor is minimized by reducing its current amplification factor (β) through appropriate designing of the layout or by another means.

In the circuit configuration described above, when the supply voltage $V_{CC}$ becomes higher than a predetermined level, the comparator 13 outputs a high-level voltage, and thereby turns the transistor 15 on. As a result, all the constant current $I_{ref}$ output from the constant-current source 16 flows into the collector of the transistor 15, and no current is fed to the bases of the transistors 21 and 4. Accordingly, the transistors 3 and 4 are turned off, and thus no current flows through the load 100. This turns the voltage at the output terminal OUT (hereinafter referred to as the "output voltage") to a high level (the level of the supply voltage).

By contrast, when the supply voltage $V_{CC}$ becomes lower than the predetermined level, the comparator 13 outputs a low-level voltage, and thereby turns the transistor 15 off. As a result, the constant current $I_{ref}$ output from the constant-current source 16 flows through the transistors 21 and 4 also. Accordingly, the transistors 3 and 4 are turned on to operate in a saturated region, and thus the output voltage becomes equal to a low level (nearly equal to the ground level). That is, the circuit shown in FIG. 1 functions as a reset circuit, or supply voltage detection circuit, that outputs a signal according to the supply voltage.

Here, let the base current of the transistor 21 be $I_{B21}$, the current amplification factor of the transistor 21 be $h_{FE21}$, the ratio of the emitter area of the transistor 23 to that of the transistor 22 be n, the base-emitter voltage of the transistor 3 be $V_{BE3}$, and the resistance of the resistor 24 be R, then the base current $I_{B3}$ of the transistor 3 is given by $$I_{B3} = n \cdot h_{FE21} \cdot I_{B21} - V_{BE3}/R$$

Moreover, in this embodiment, circuit constants are set in such a way that the desired output voltage is obtained when the transistors 3 and 4 are turned on with the heaviest permissible load connected as the load 100.

In the circuit configuration described above, the lighter the load 100, the lower the current that flows through the transistor 3 when the transistors 3 and 4 are turned on, and thus the lower the output voltage. As the output voltage decreases, the emitter-base voltage of the transistor 5 increases, and accordingly the current that flows from the constant-current source 16 into the emitter of the transistor 5 increases.

In this way, the transistor 5 operates in such a way that, the lighter the load 100, the lower the input current to the current amplifier circuit 2 (i.e. the base current of the transistor 21). This helps reduce the amount of extra current that is fed to the base of the transistor 3 when it is turned on, and thereby reduce unnecessary current consumption.

Moreover, the lighter the load 100, the higher the current that flows from the constant-current source 16 into the emitter of the transistor 5, and thus the lower the input current to the current amplifier circuit 2. This helps reduce current consumption.

Moreover, the lighter the load 100, the lower the currents that need to be fed to the bases of the transistors 3 and 4 to turn them on. This helps reduce variation in the output voltage obtained when the transistors 3 and 4 are turned on in the face of variation in the resistance of the load 100.

In this embodiment, the use, as the transistor 5, of the transistor parasitic on the transistor 4 helps increase the withstand voltage against electrostatic destruction. It is also possible to omit the supply voltage detection circuit 1 so that the output current is controlled according to the resistance of the load alone, irrespective of the supply voltage.

What is claimed is:

1. A semiconductor device comprising:

a constant-current source;

a current amplifier circuit that is connected to an output side of the constant-current source;

a first transistor that receives at a base thereof a current output from the current amplifier circuit, has an emitter thereof connected to a reference potential, and has a collector thereof connected to an output terminal;

a second transistor that has a base thereof connected to the output terminal, has an emitter thereof connected to the output side of the constant-current source, and has a collector thereof connected to the reference potential, the second transistor being of an opposite conductivity type to the first transistor; and a third transistor that has a base thereof connected to the output side of the constant-current source, has an emitter thereof connected to the reference potential, and has a collector thereof connected to the output terminal, wherein the second transistor in conjunction with the third transistor operates so as to control the amount of current fed to the base of the first transistor by diverting and receiving part of a current directed to the current amplifier circuit before the current is fed thereinto.

2. A semiconductor device as claimed in claim 1, wherein the second transistor is formed so as to be parasitic on a structure of the third transistor.

3. A semiconductor device as claimed in claim 1, further comprising:

a supply voltage detection circuit that chooses whether to short-circuit the output side of the constant-current source to the reference potential or not according to a supply voltage.

4. A semiconductor device comprising:

a current amplifier circuit that is connected to an output side of a constant-current source;

a first transistor that has a base there of connected to an output side of the current amplifier circuit, has an emitter thereof connected to a reference potential, and has a collector thereof connected to an output terminal;

a second transistor that has an emitter thereof connected to the output side of the constant-current source, has a collector thereof connected to the reference potential, and has a base thereof connected to the output terminal; and a third transistor that has a base thereof connected to an input side of the current amplifier circuit, has an emitter thereof connected to the reference potential, and has a collector thereof connected to the output terminal, wherein the second transistor operates so as to divert part of a current directed to the input side of the current amplifier circuit according to a voltage at the output terminal.

5. A semiconductor device as claimed in claim 4, wherein the second transistor is formed so as to be parasitic on a structure of the third transistor.

6. A semiconductor device as claimed in claim 4, further comprising:

a supply voltage detection circuit that determines whether to short-circuit the output side of the constant-current source to the reference potential or not short-circuit the output side according to a supply voltage.

7. A semiconductor device as claimed in claim 6, wherein, when the supply voltage is lower than a predetermined voltage, the second transistor diverts part of the current directed to the input side of the current amplifier circuit.

8. A semiconductor device as claimed in claim 6, wherein, when the supply voltage is lower than a predetermined voltage, an output signal fed from the output terminal is at a lower level, and when the supply voltage is equal to or higher than the predetermined voltage, the output signal fed from the output terminal is at a higher level so that the output signal is supplied as a supply voltage status signal indicating that the supply voltage reaches the predetermined voltage or not to other circuits and/or devices sharing the identical supply voltage for use as a reset signal.

* * * * *